(12) United States Patent
Lee et al.

(10) Patent No.: US 6,933,245 B2
(45) Date of Patent: Aug. 23, 2005

(54) METHOD OF FORMING A THIN FILM WITH A LOW HYDROGEN CONTENT ON A SEMICONDUCTOR DEVICE

(75) Inventors: Seung-Hwan Lee, Seoul (KR); Jong-Ho Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 198 days.

(21) Appl. No.: 10/403,572

(22) Filed: Mar. 31, 2003

(65) Prior Publication Data

US 2003/0228770 A1 Dec. 11, 2003

(30) Foreign Application Priority Data

Jun. 5, 2002 (KR) .................................. 2002-0031724

(51) Int. Cl.[7] .......................................... H01L 21/469
(52) U.S. Cl. ...................... 438/778; 438/792; 438/798; 438/216
(58) Field of Search ................................ 438/216, 287, 438/758–799, 479–509

(56) References Cited

U.S. PATENT DOCUMENTS

| | | | | |
|---|---|---|---|---|
| 4,962,065 A | * | 10/1990 | Brown et al. ................ | 438/792 |
| 5,516,731 A | * | 5/1996 | Toutounchi et al. .......... | 438/13 |
| 5,837,592 A | * | 11/1998 | Chang et al. ................ | 438/382 |
| 6,436,801 B1 | * | 8/2002 | Wilk et al. .................. | 438/591 |
| 6,811,831 B1 | * | 11/2004 | Chung et al. ................ | 427/578 |
| 2002/0048635 A1 | * | 4/2002 | Kim et al. ................... | 427/331 |
| 2003/0082296 A1 | * | 5/2003 | Elers et a. ................... | 427/96 |
| 2003/0190802 A1 | * | 10/2003 | Wang et al. ................. | 438/672 |
| 2004/0062081 A1 | * | 4/2004 | Drewes .................. | 365/185.28 |
| 2004/0121085 A1 | * | 6/2004 | Wang et al. ................. | 427/569 |
| 2004/0147101 A1 | * | 7/2004 | Pomarede et al. .......... | 438/591 |
| 2004/0169177 A1 | * | 9/2004 | Asami et al. ................. | 257/64 |

FOREIGN PATENT DOCUMENTS

| | | |
|---|---|---|
| JP | 10163197 | 6/1998 |
| KR | 0196277 | 11/2001 |
| KR | 0275738 | 3/2003 |

OTHER PUBLICATIONS

English Abstract.

* cited by examiner

Primary Examiner—Savitri Mulpuri
(74) Attorney, Agent, or Firm—F. Chau & Associates LLC

(57) ABSTRACT

A method of forming a thin film with a low hydrogen contents is provided by positioning a substrate inside a processing chamber, and supplying reacting materials into the chamber, chemisorbing a portion of the reacting materials onto the substrate. Then, a nitrogen ($N_2$) remote plasma treatment is performed to reduce the hydrogen content of thin film layer formed by chemisorption of the reacting materials on the substrate. Accordingly, a thin film is formed having a low hydrogen content, since the hydrogen bonds in the thin film layer formed by chemisorption of the reacting materials are removed.

15 Claims, 9 Drawing Sheets

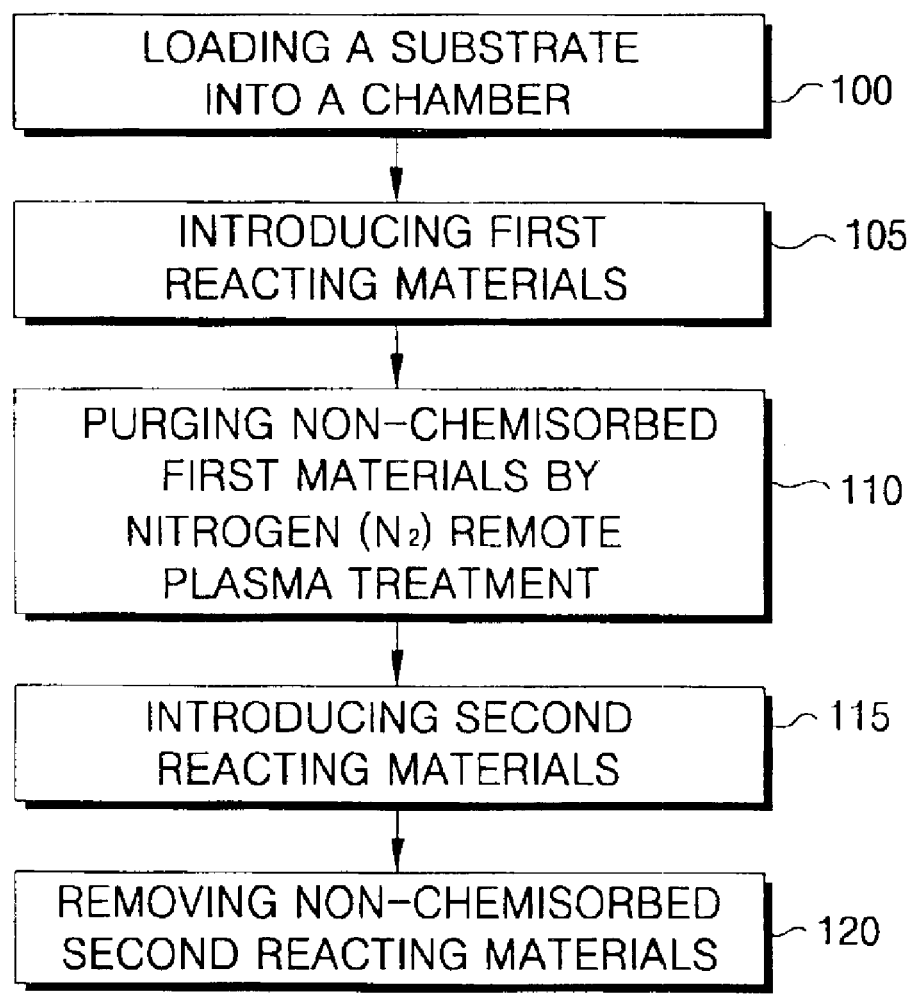

FIG.8

| | TEMPERATUAE [°C] | THICKNESS [Å] | N-H [atoms/cm³] | Si-H [atoms/cm³] | TOTAL HYDROGEN [atoms/cm³] | N-H [%] | Si-H [%] | TOTAL HYDROGEN [%] |
|---|---|---|---|---|---|---|---|---|
| CONVENTIONAL METHOD | 550 | 500 | 1.13E22 | 6.58E20 | 1.20E22 | 11.11 | 0.64 | 11.75 |
| EMBODIMENT 1 | 550 | 500 | 6.10E21 | 6.37E20 | 6.74E21 | 6.30 | 0.66 | 6.95 |
| EMBODIMENT 2 | 550 | 500 | 9.28E21 | 7.14E20 | 9.99E21 | 9.26 | 0.71 | 9.98 |
| EMBODIMENT 3 | 550 | 500 | 8.67E21 | 4.10E19 | 8.71E21 | 8.77 | 0.04 | 8.81 |
| EMBODIMENT 4 | 550 | 500 | 1.07E22 | 4.82E20 | 1.12E22 | 10.54 | 0.48 | 11.02 |

METHOD OF FORMING A THIN FILM WITH A LOW HYDROGEN CONTENT ON A SEMICONDUCTOR DEVICE

BACKGROUND OF THE INVENTION

1. Technical Field of the Invention

The present invention generally relates to a method of forming a thin film on a semiconductor device; more particularly, a method of forming a thin film on a semiconductor device using an atomic layer deposition (ALD) process.

2. Discussion of the Related Art

As semiconductor devices become more highly integrated, process conditions for forming a thin film on the semiconductor device, such as low heat budget, good step coverage, precise control for a thickness of the thin film, a low contaminated environment, etc., become more important.

The conventional deposition process, such as a low-pressure chemical vapor deposition (LPCVD) process, and plasma-enhanced chemical vapor deposition (PECVD) process are not suitable for forming a thin film on a state-of-the-art semiconductor device. For example, a conventional CVD process deposits a thin film at a relatively high temperature, which severely influences a semiconductor device, e.g., the redistribution of dopants in the substrate. In addition, the thickness of the thin film deposited by a CVD process varies across the surface of the semiconductor device. That is, the thickness of the thin film deposited around the surface area of a semiconductor substrate having a high density is thinner than the lower density surface areas of the semiconductor substrate, which causes a loading effect.

A thin film deposited through the LPCVD process (LPCVD thin film) contains a high percentage of hydrogen and has poor step coverage. On the other hand, a thin film deposited using a PECVD deposits a thin film at a relatively low temperature as compared with the LPCVD thin film, but it also has poor step coverage.

To avoid the above problems, an atomic layer deposition (hereinafter referred to as "ALD") process, which can deposit a thin film at a relatively low temperature with good step coverage and without loading effect thereon, has been proposed.

U.S. Pat. No. 6,124,158 discloses an ALD process. According to the '158 patent, a first reactive material is introduced onto a treated surface, which means an operating surface of a semiconductor substrate that any treatment or process for manufacturing the semiconductor device is carried out, and a mono-layer is deposited on the treated surface by chemical reaction of the first reacting material. Then, a second reactive material is introduced and is chemically reacted with the treated surface to thereby form a desired thin film. After each of the above steps is carried out, a processing chamber in which the deposition process has been performed is purged of the reactive materials in order that the reactive materials are not chemically reacted with a remaining surface except the treated surface of the substrate.

When a thin film of silicon nitride (SiN) is deposited through the ALD process, the process temperature can be reduced up to about 100° C. as compared with the conventional processing temperature of 780° C. in the LPCVD process, and conformality of the thin film is excellent. Generally, a nitride layer, such as a $Si_3N_4$ layer, is usually used as a capping layer for protecting underlying layers due to an excellent diffusion barrier characteristic thereof. In addition, the nitride layer is also frequently used as an etch-stopping layer due to high etching ratio thereof. Accordingly, an etching ratio characteristic plays an important role when depositing the nitride.

However, even though a SiN layer deposited using an ALD process has good step coverage and a low processing temperature, there is a problem with the dry and wet etching characteristic of the deposited layer. The layer deposited by an ALD process is inferior to that deposited using the high temperature CVD process because of the relatively high hydrogen content in the layer. As a result, when the SiN thin film containing a high percentage of hydrogen is used as a spacer of a gate electrode of the semiconductor device, hydrogen atoms in the SiN thin film are diffused into a gate oxide layer by the heat budget in the process, which functions as an impurity trap and thereby deteriorating the characteristics of a transistor.

FIG. 1 is a graph showing the hydrogen content in the thin films deposited using various deposition processes. The hydrogen content in the thin films was measured by using FTIR-RAS (Fourier transform infrared reflection absorption spectroscopy). T350, T400, T450, T500, T550 and T595 mean that the ALD process was carried out at a temperature of 350° C., 400° C., 450° C., 500° C., 550° C. and 595° C., respectively. LP680 and LP780 mean that the LPCVD process was carried out at a temperature of 680° C. and 780° C., respectively. The PE-CVD means that the PECVD process was carried out.

As shown in FIG. 1, the hydrogen content in the SiN thin film deposited using an ALD process is higher than that of other SiN thin film deposited using a LPCVD at a high temperature of 780° C. As the design rule of a device pattern becomes narrower, a lower process temperature in the fabrication of the semiconductor devices is required.

U.S. Pat. No. 5,876,918 discloses a method of forming an insulating layer by using a gas without a chemical bond of nitride and hydrogen (N-H bond), such as a nitride layer deposited using a CVD process using nitrogen ($N_2$) gas. However, the above method has a problem that the deposited layer is non-uniform in thickness and is of a poor quality.

In addition, there has been suggested a method of forming a nitride layer of low hydrogen content by using a nitrogen ($N_2$) plasma gas or nitrogen (N) radical. However, when the plasma gas is directly applied onto the silicon substrate, the plasma gas increases the interface-state density in semiconductor device and fixes the charges in the nitride layer, thereby causing damage to the substrate.

A need therefore exists for a method using the ALD process, which can be carried out at a relatively low temperature, to deposit a thin film having a low hydrogen content or low hydrogen concentration in the deposited thin film.

SUMMARY OF THE INVENTION

A method of depositing a thin film layer having low hydrogen content at a low temperature is provided.

Also provided is a method of forming a thin film on a semiconductor substrate, and treating the thin film with a nitrogen ($N_2$) remote plasma treatment to thereby reduce the hydrogen content in the thin film.

According to an embodiment of the present invention, there is provided a method of forming a thin film, comprising the steps of (a) positioning a substrate inside a chamber, (b) introducing reacting materials into the chamber, (c) chemisorbing a portion of the reacting materials onto the substrate, and (d) carrying out a nitrogen ($N_2$) remote plasma treatment to reduce the hydrogen content in the chemisorbed reacting materials on the substrate.

According to another embodiment of the present invention, there is provided a method of forming a thin film, comprising the steps of (a) positioning a substrate inside a chamber, (b) introducing first reacting materials into the chamber, (c) forming a single atomic layer on the substrate by chemisorbing a portion of the first reacting materials on the substrate, (d) treating the single atomic layer with a first nitrogen ($N_2$) remote plasma treatment to reduce the hydrogen content in the single atomic layer, (e) introducing second reacting materials into the chamber; and (f) forming a thin film on the substrate by reacting a portion of the second reacting materials with the single atomic layer.

According to still another embodiment of the present invention, there is provided a method of forming a thin film, comprising the steps of (a) positioning a substrate inside a chamber, (b) introducing first reacting materials into the chamber, (c) forming a single atomic layer on the substrate by chemisorbing a portion of the first reacting materials on the substrate, (d) removing the non-chemisorbed first reacting materials from the chamber, (e) introducing second reacting materials into the chamber, (f) forming a thin film on the substrate by reacting a portion of the second reacting materials with the single atomic layer, and (g) treating the thin film with a nitrogen ($N_2$) remote plasma treatment to reduce the hydrogen content in the thin film.

According to another embodiment of the present invention, a nitrogen ($N_2$) gas activated using the remote plasma process is introduced onto the single atomic layer formed by the first reacting material or the thin film formed by chemical reaction between the single atomic layer and the second reacting material. As a result, the hydrogen bonds in the single atomic layer or the thin film, such as a chemical bond between a nitrogen atom and a hydrogen atom (hereinafter referred to as N—H bond), are removed, and therefore, the hydrogen content in the thin film is reduced.

BRIEF DESCRIPTION OF THE DRAWINGS

The above and other objects, features and advantages of the present invention will become more apparent from the following detailed description of the preferred embodiments thereof made with reference to the attached drawings, of which:

FIG. 4 is a flow chart for explaining a method of forming a thin film according to a first embodiment of the present invention;

FIG. 8 is a table showing the hydrogen content in a silicon nitride (SiN) layer formed by the conventional method and various embodiments of the present invention.

DESCRIPTION OF PREFERRED EMBODIMENTS

Hereinafter, preferred embodiments of the present invention will be described in detail with reference to accompanying drawings.

Figure 1:
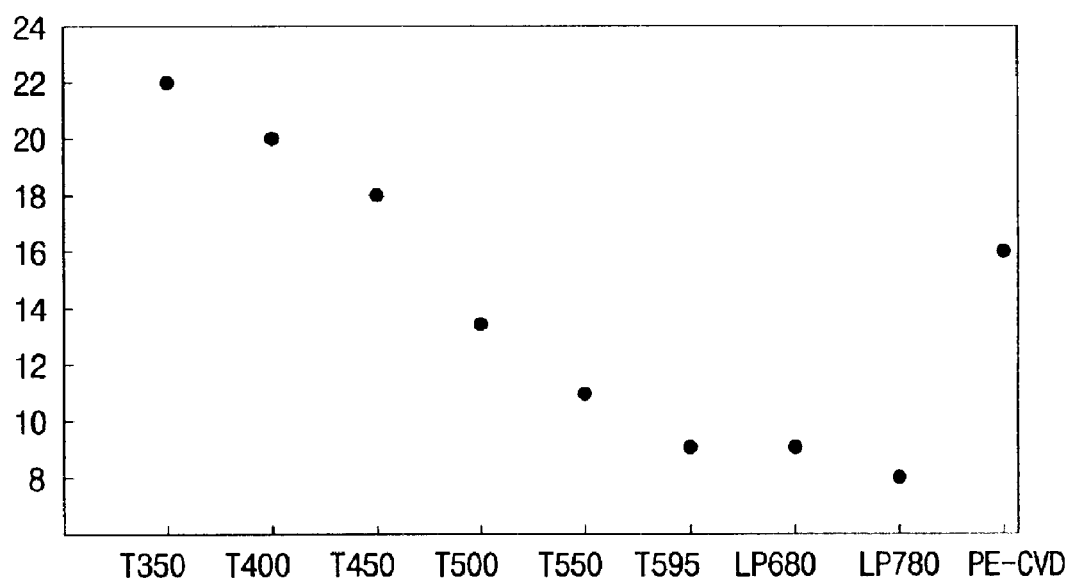
FIG. 1 is a graph showing a relationship between hydrogen content in a silicon nitride (SiN) thin film verses various deposition processes for forming the silicon nitride (SiN) thin film.
Figure 2:
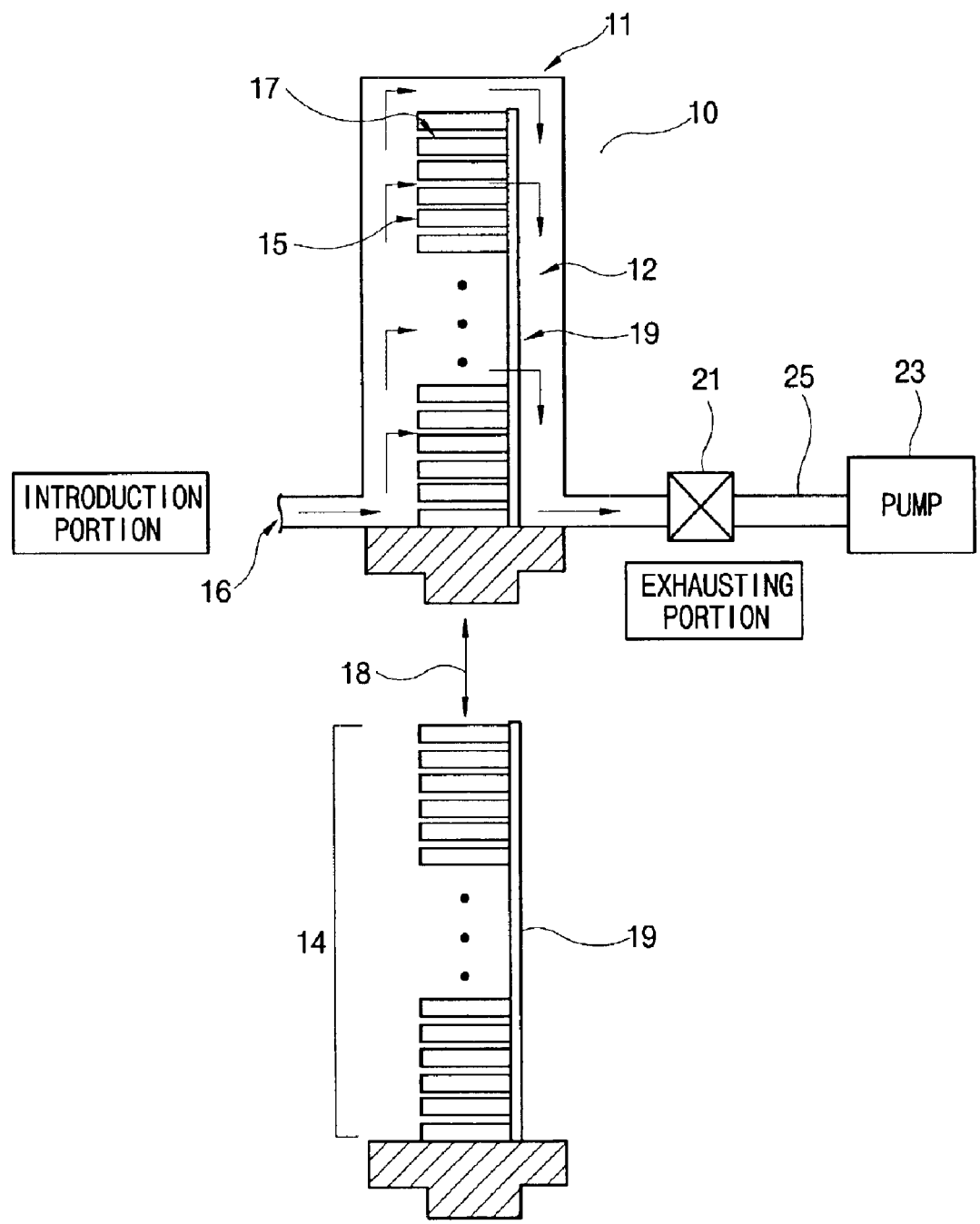
FIG. 2 is a schematic cross-sectional view showing an apparatus for depositing a thin film by carrying out a method of forming a thin film using an atomic layer deposition process according to a preferred embodiment of the present invention.

FIG. 2 is a schematic cross-sectional view showing an apparatus for depositing a thin film by carrying out a method of forming a thin film using an atomic layer deposition process according to a preferred embodiment of the present invention. FIGS. 3A to 3D show each processing steps for forming a thin film by using the apparatus as shown in FIG. 2. The apparatus for forming a thin film as shown in FIG. 2 is disclosed in commonly assigned U.S. patent application Ser. No. 09/872,203, entitled "A method of forming a thin film by using an atomic layer deposition process." The disclosure of which is incorporated-by-reference herein. The apparatus for forming a thin film as disclosed in the above patent application can be used for the processes of the preferred embodiments of the present invention.

Referring to FIG. 2, a chamber 10 having a unitary reactive space 12 is installed in a processing tube 11. A member installed at one side of the chamber 10, such as a heater, is omitted for simplicity. Preferably, the chamber 10 is a vertical type chamber shaped into a furnace similar to the conventional LPCVD furnace disclosed in U.S. Pat. No. 5,217,340 and U.S. Pat. No. 5,112,641.

However, various other types of chambers, e.g., a horizontal type chamber, can be used within the scope of the present invention.

According to a preferred embodiment of the present invention, the reactive space 12 can be a space in which a plurality of substrates or wafers 15 are positioned and a process for depositing an atomic layer is sequentially carried out.

When a process for forming a thin film is carried out by using the chamber 10, a bundle 14 of the plurality of substrates 15 is loaded into the unitary reactive space 12 of the chamber 10. The bundle 14 of the plurality of substrates 15 can be a total number of the substrates loaded into the chamber 10 for forming the thin film on a respective substrate 15 using an ALD process. Preferably, each of the substrates 15 has a processing surface at the top most portion thereof.

According to an ALD process of the present invention, the bundle 14 of the plurality of substrates 15 is loaded into the chamber 10 by using a wafer auto-carrier 18. The wafer auto-carrier 18 is one of the carriers disclosed in U.S. Pat. No. 5,127,340 or 5,112,641. However, various shaped auto-carriers can be used within the scope of the present invention. The bundle 14 of the plurality of substrates 15 is arranged and positioned inside a boat 19 according to a setting order. The boat 19 is conventionally made of quartz or other common materials, and has a plurality of grooves on an inner surface thereof. The plurality of substrates 15 are positioned in the grooves of the boat 19. The boat 19 including the bundle 14 of the plurality of substrates 15 is loaded into the chamber 10, and as a result, the bundle 14 of the plurality of substrates 15 is simultaneously loaded into the unitary reactive space 12 of the chamber 10. At that time, each of the substrates 15 is positioned in the grooves of the boat 19 in such a manner that the utmost top surface 17, e.g., the processing surface, of each substrates 15 faces substantially the same direction.

Figure 3A:
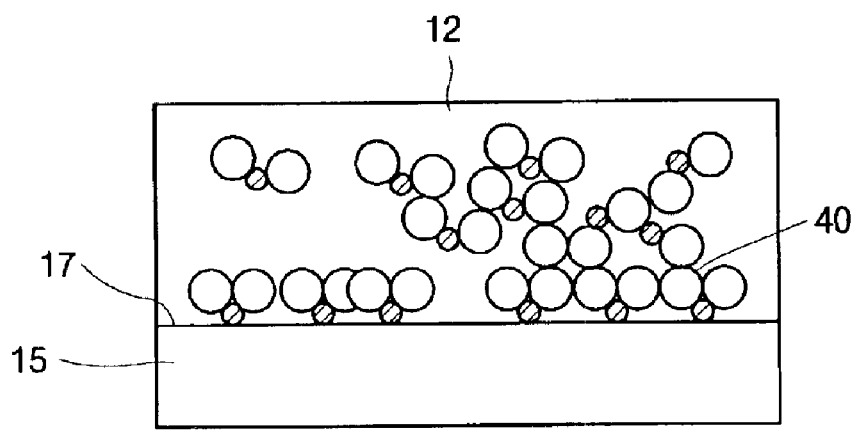
FIGS. 3A to 3D are cross-sectional views showing processing steps for forming a thin film using an atomic layer deposition process according to another preferred embodiment of the present invention.

After positioning the plurality of substrates 15 inside the chamber 10, a first reacting materials 40 or a gas including the first reacting materials, such as dichlorosilane ($SiH_2Cl_2$, hereinafter referred to as "DCS") gas as shown in FIG. 3A, is supplied into the unitary reactive space 12 of the chamber 10 through an introducing portion 16 as shown in FIG. 2 that is connected with a gas supply line (not shown) (dosing step, or ion implanting step). Then, a portion of the first reacting materials 40 is chemisorbed (chemically absorbed) onto the processing surface or the top surface 17 of the substrate 15 in the unitary reactive surface 12 to thereby form a single atomic layer 30 on the processing surface 17 of the substrate 15.

Figure 3B:
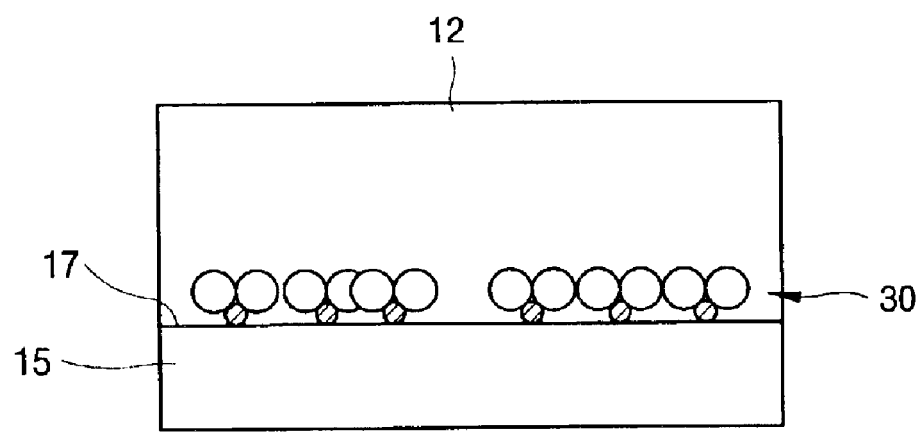

Subsequently, as shown in FIG. 3B, a first purge step is carried out for removing the non-chemisorbed first reacting materials from the chamber 10. The non-chemisorbed reacting materials include first reacting materials physisorbed (physically absorbed) onto the substrate. To carry out the purge step, the chamber 10 according to a preferred embodiment of the present invention includes an exhaust line 25 and pressure control valve 21. The exhaust line 25 is connected to a pump 23, and the non-chemisorbed first reacting materials are exhausted through the exhaust line 25. During the purge step, the pressure control valve 21 is substantially closed, and inert gases are introduced into the chamber 10 through the introducing portion 16. Simultaneously, the first reacting materials 40 are no longer supplied into the chamber 10. Preferably, all or substantially all of the non-chemisorbed first reacting materials are removed from the chamber 10 by pumping out the non-chemisorbed first reacting materials from the chamber 10 through the exhaust line 25 using the pump 23.

Figure 3C:
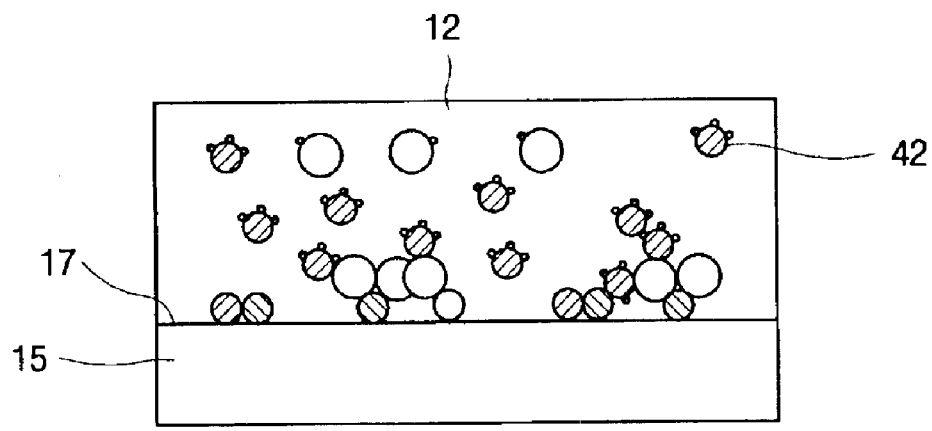
Figure 3D:
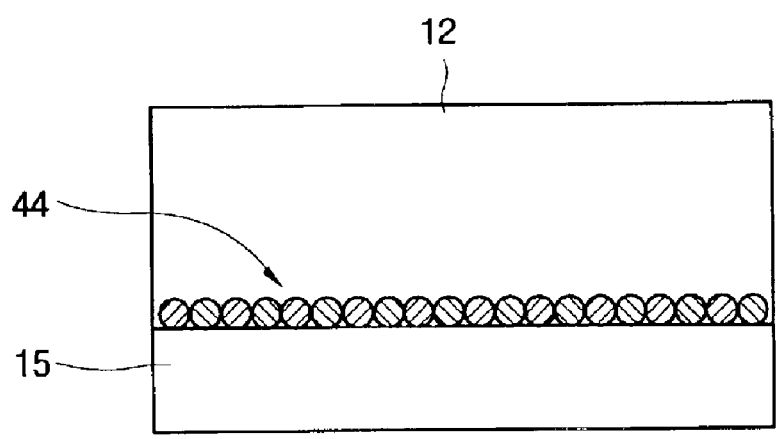

After removing the non-chemisorbed first reacting materials 40 from the unitary reactive space 12, second reacting materials 42 or gases including the second reacting materials, e.g., ammonia ($NH_3$) gas as shown in FIG. 3C, are supplied into the unitary reactive space 12 of the chamber 10 (dosing step). Then, the second reacting materials are chemically reacted with the single atomic layer 30 formed on the substrate 10, to thereby form a thin film as shown in FIG. 3D, e.g., silicon nitride ($Si_3N_4$) thin film. The second purge step is carried out for removing all or substantially all of the non-chemisorbed second reacting materials from the reactive space 12 in the same way as in the first purge step.

According to another embodiment of the present invention, a thin film having a desired thickness can be formed by repeating the introducing step of the first and the second reacting materials 40 and 42 and the removing step for removing non-chemisorbed first and second reacting materials from the reactive space 12.

According to another preferred embodiment of the present invention, after the single atomic layer is deposited on the processing surface 17 of the substrate 15 by chemisorbing the first reacting materials 40 onto the substrate 15, the hydrogen content of the single atomic layer 30 is reduced by carrying out a nitrogen ($N_2$) remote plasma treatment on the single atomic layer 30. At that time, the nitrogen ($N_2$) remote plasma treatment can be carried out without additionally performing the first purge step for removing all or substantially all of the non-chemisorbed first reacting materials 40, or after performing the first purge step. Namely, the first purge step can be simultaneously performed using the plasma gas during the nitrogen ($N_2$) remote plasma treatment, since the purge step usually uses inert gases, e.g., nitrogen ($N_2$).

When the nitrogen ($N_2$) remote plasma treatment is carried out after forming the single atomic layer, such as a silicon (Si) layer, on the substrate 15 by using the first reacting materials 40, activated nitrogen ($N_2$) molecules collide into the processing surface 17 of the substrate 15. As a result, the hydrogen bonds in the single atomic layer 30, such as a chemical bond between a silicon atom and a hydrogen atom (Si—H bond), can be removed. Then, the second reacting materials are introduced into the chamber to thereby form the thin film with a low hydrogen content.

Generally, the direct supply of plasma gas onto the substrate causes damage to the substrate due to the plasma gas increasing the interface-state density in a semiconductor device and fixes the charges in the nitride layer. However, according to another embodiment of the present invention, damage to a surface of the silicon substrate due to the plasma gas is not caused because the nitrogen ($N_2$) plasma gas is activated in an outer remote plasma generator, which is installed on an outside portion of the chamber, and introduced into the chamber. As a result, the damage to the surface of the silicon substrate is prevented.

In addition, according to another embodiment of the present invention, after chemisorbing the second reacting materials 42 to thereby form the thin film 44, the nitrogen ($N_2$) remote plasma treatment is carried out so that the hydrogen content in the thin film 44 is reduced. At that time, the nitrogen ($N_2$) remote plasma treatment can be carried out without additionally performing a second purge step for removing non-chemisorbed second reacting materials 42, or after performing the first purge step.

As described above, when the second reacting materials 42 are introduced into the chamber and the thin film 44 is formed on the single atomic layer 30, such as a silicon layer, deposited by using the first reacting materials 40, and the nitrogen ($N_2$) remote plasma treatment is performed on the thin film 44, the hydrogen bonds in the thin film 44, such as nitrogen-hydrogen bond (N—H bond), are broken. Therefore, the hydrogen content in the thin film 44 is drastically reduced.

According to still another embodiment of the present invention, the first nitrogen ($N_2$) remote plasma treatment is carried out after the dosing step of the first reacting materials 40, and the second nitrogen ($N_2$) remote plasma treatment is carried out after the dosing step of the second reacting materials 42. At that time, the first purge step for removing all or substantially all of the non-chemisorbed first reacting materials can be performed at the same time or after the first nitrogen ($N_2$) remote plasma treatment is carried out. In the same way, the second purge step for removing all or substantially all of the non-chemisorbed first reacting materials can be performed at the same time or after the first nitrogen ($N_2$) remote plasma treatment is carried out.

Embodiment 1

FIG. 4 is a flow chart explaining a method of forming a thin film according to a first embodiment of the present invention. Referring to FIG. 4, a method of forming a thin film according to the present embodiment is described as follows. Silicon nitride (SiN) is deposited using a ALD process, as described above, at a temperature of about 550°

C. The DCS gas and the ammonia (NH₃) gas are used as the first and the second reacting materials, respectively. A flow rate of the ammonia (NH₃) gas to the DCS gas is about 4.5:1. The ammonia (NH₃) gas is provided by a remote plasma generator.

First, a silicon substrate is loaded into the chamber (step 100). A DCS dosing step is carried out for about 20 seconds so as to introduce the first reacting materials (step 105), and then the chamber is pumped out for about 10 seconds so that the internal pressure of the chamber is in a vacuum state. Next, the nitrogen (N₂) gas, activated by the remote plasma generator, is introduced. The activated nitrogen (N₂) gas not only purges non-chemisorbed DCS from the chamber, but also removes the hydrogen bonds of the single atomic layer, such as a silicon layer, deposited on the substrate by the DCS. The nitrogen (N₂) gas plasma treatment step, e.g., the DCS purging step, is performed for about 10 seconds (step 110).

Next, an ammonia (NH₃) gas, activated by the remote plasma generator, is dosed for about 35 seconds as the second reacting material (step 115). Then, non-chemisorbed ammonia (NH₃) gas is purged from the chamber for about 10 seconds by using an inert gas, such as nitrogen (N₂) gas (step 120). Subsequently, the chamber is pumped out for about 10 seconds so that the internal pressure of the chamber is in a vacuum state. As a result, all or substantially all of the residual gases remaining in the chamber are removed from the chamber.

The following table 1 shows a processing time and a flow rate at each step of the whole process flow according to the first embodiment of the present invention.

TABLE 1

|  | DCS dosing | Vacuum treatment | DCS purging | NH3 dosing | NH3 purging | Vacuum treatment |
| --- | --- | --- | --- | --- | --- | --- |
| Processing time (sec) | 20 | 10 | 10 | 35 | 3 | 10 |
| Flow rate (slm) | 1 | 0 | 2 | 4.5 | 2 | 0 |
| Plasma |  |  | On | On |  |  |

Embodiment 2

Figure 5:
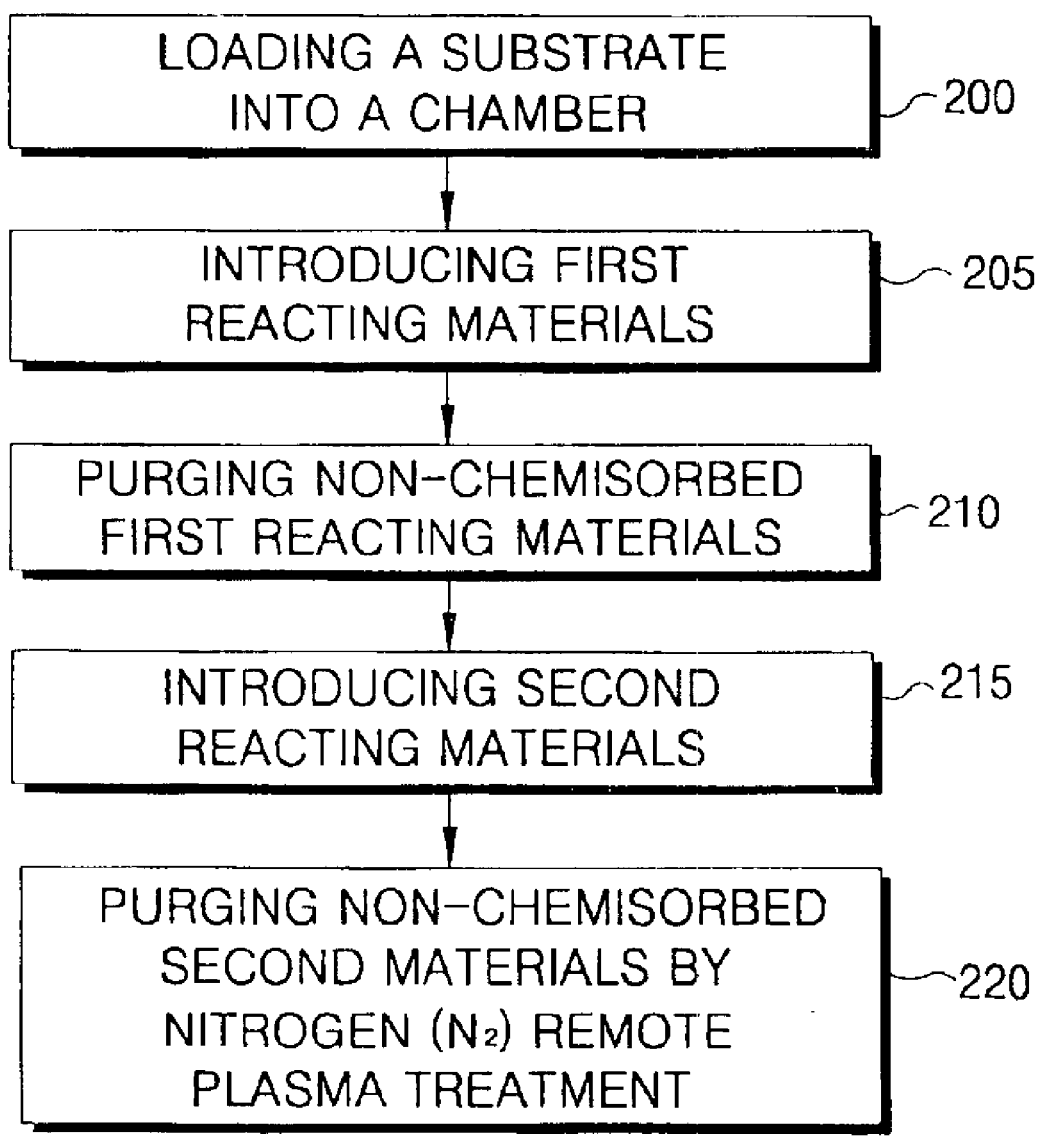
FIG. 5 is a flow chart for explaining a method of forming a thin film according to a second embodiment of the present invention.

FIG. 5 is a flow chart explaining a method of forming a thin film according to a second embodiment of the present invention. Referring to FIG. 5, the method of forming a thin film according to the present embodiment is described as follows.

A silicon nitride (SiN) is deposited using an ALD process, as described above, at a temperature of about 550° C. The DCS gas and the ammonia (NH₃) gas are used as the first and the second reacting materials, respectively. A flow rate of the ammonia (NH₃) gas to the DCS gas is about 4.5:1. The ammonia (NH₃) gas is provided from remote plasma generator.

First, a silicon substrate is loaded into the chamber (step 200). A DCS dosing step is carried out for about 20 seconds to supply the first reacting materials in to the chamber (step 205), and then the non-chemisorbed DCS are purged from the chamber by supplying an inert gas, e.g., a nitrogen (N₂) gas, into the chamber for about 3 seconds (step 210). And, all or substantially all of the residual gases remaining in the chamber are removed by performing a vacuum treatment to the inside of the chamber for about 4 seconds. Then, an ammonia (NH₃) gas, activated by the remote plasma generator, is dosed as the second reacting material for about 35 seconds (step 215), and then the chamber is pumped out for about 4 seconds so that the internal pressure of the chamber is in a vacuum state. Next, the nitrogen (N₂) gas, activated by the remote plasma generator, is introduced into the chamber (step 220). And, the activated nitrogen (N₂) gas not only purges non-chemisorbed ammonia gas (NH₃) from the chamber, but also removes the hydrogen bonds of a silicon nitride (SiN) layer deposited on the substrate (step 220). The nitrogen (N₂) remote plasma treatment, e.g., ammonia (NH₃) purging step, is carried out for about 10 seconds.

The following table 2 shows a processing time and a flow rate at each step of the whole process according to the second embodiment of the present invention.

TABLE 2

|  | DCS dosing | DCS purging | Vacuum treatment | NH3 dosing | Vacuum treatment | NH3 purging |
| --- | --- | --- | --- | --- | --- | --- |
| Processing time (sec) | 20 | 3 | 4 | 35 | 4 | 10 |
| Flow rate (slm) | 1 | 2 | 0 | 4.5 | 0 | 2 |
| Plasma |  |  |  | On |  | On |

Embodiment 3

Figure 6:
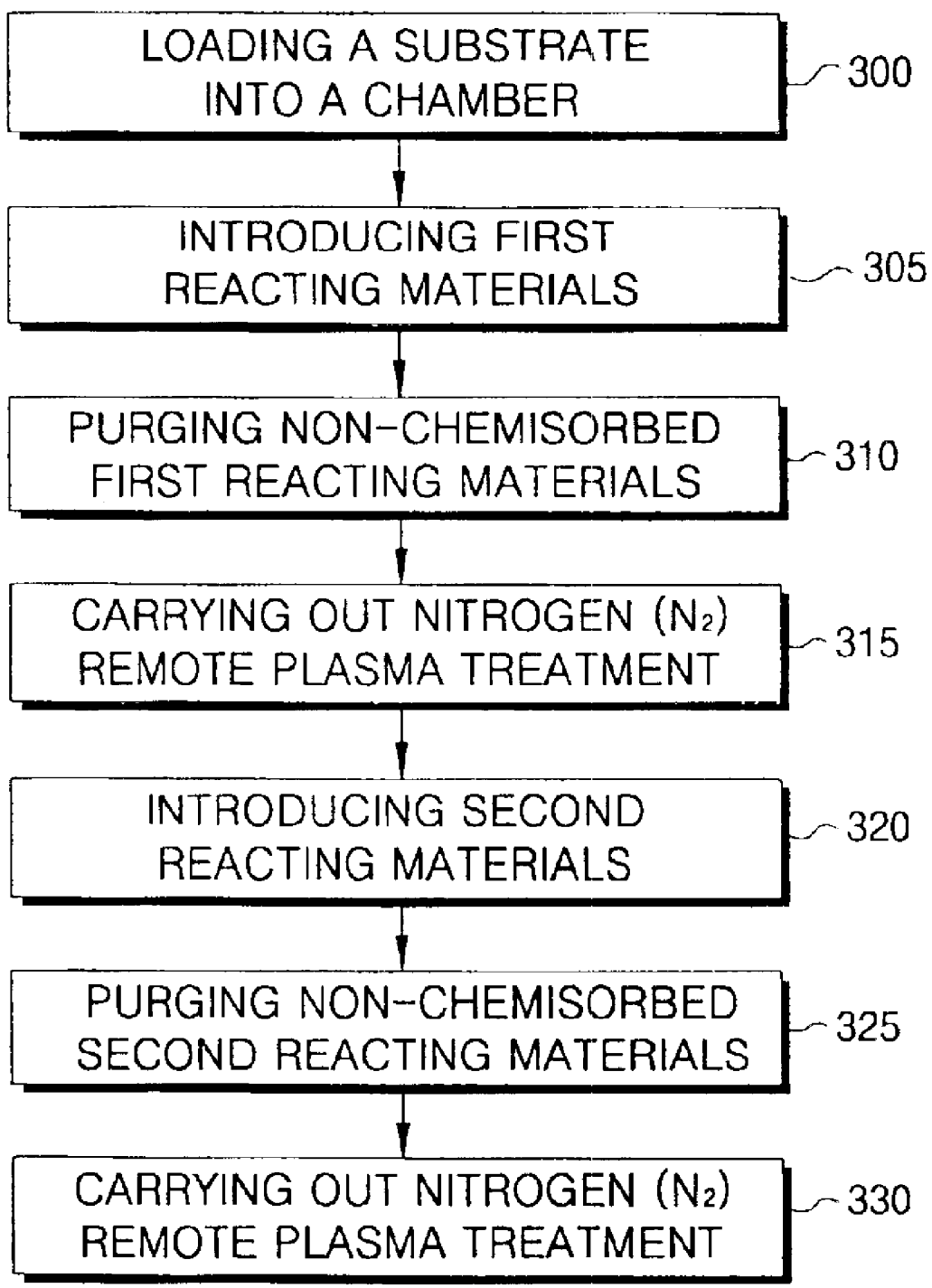
FIG. 6 is a flow chart for explaining a method of forming a thin film according to a third embodiment of the present invention.

FIG. 6 is a flow chart for explaining a method of forming a thin film according to a third embodiment of the present invention.

According to this embodiment, a silicon nitride (SiN) is deposited using an ALD process, as described above, at a temperature of about 550° C. The DCS gas and the ammonia (NH₃) gas are used as the first and the second reacting materials, respectively. A flow rate of the ammonia (NH₃) gas to the DCS gas is about 4.5:1. The ammonia (NH₃) gas is provided by a remote plasma generator.

First, a silicon substrate is loaded into the chamber (step 300). A DCS dosing step is carried out for about 20 seconds to supply the first reacting materials into the chamber (step 305), and then the non-chemisorbed DCS is purged from the chamber by supplying an inert gas, e.g., as a nitrogen (N₂) gas, into the chamber for about 3 seconds (step 310). After the chamber is purged of non-chemisorbed DCS, the chamber is pumped out for about 4 seconds so that the internal pressure of chamber is in vacuum state. As a result, all or substantially all of the residual gases remaining in the chamber are removed from the chamber. Then, a first nitrogen (N₂) gas, activated by the remote plasma generator, is introduced into the chamber. The activated first nitrogen (N₂) gas removes the hydrogen bonds from a single atomic layer, such as a silicon layer, deposited on the substrate (step 315). The first nitrogen (N₂) remote plasma treatment is carried out for about 10 seconds (step 315).

Subsequently, an ammonia (NH₃) gas, activated by the remote plasma generator, is dosed as a second reacting material for about 35 seconds (step 320), and then the non-chemisorbed ammonia (NH₃) is purged from the chamber by supplying an inert gas, e.g., nitrogen (N₂) gas for about 3 seconds (step 325). The chamber is then pumped out for about 4 seconds so that the internal pressure of the chamber is in a vacuum state. As a result, all or substantially all of the residual gases remaining in the chamber are removed from the chamber. Next, a second nitrogen (N₂) gas, activated by the remote plasma generator, is introduced into the chamber (step 330). And, the activated second nitrogen (N₂) gas removes the hydrogen bonds from a silicon nitride (SiN) layer deposited on the substrate (step 330). The second nitrogen (N₂) remote plasma treatment is carried out for about 10 seconds.

The following table 3 shows a processing time and a flow rate at each step of the whole process according to the third embodiment of the present invention.

TABLE 3

|  | DCS dosing | DCS purging | Vacuum treatment | First N2 plasma treatment | NH3 dosing | NH3 purging | Vacuum treatment | First N2 plasma treatment |
|---|---|---|---|---|---|---|---|---|
| Processing time (sec) | 20 | 3 | 4 | 10 | 35 | 3 | 4 | 10 |
| Flow rate (slm) | 1 | 2 | 0 | 2 | 4.5 | 2 | 0 | 2 |
| Plasma |  |  |  | On | On |  |  |  |

Embodiment 4

Figure 7:
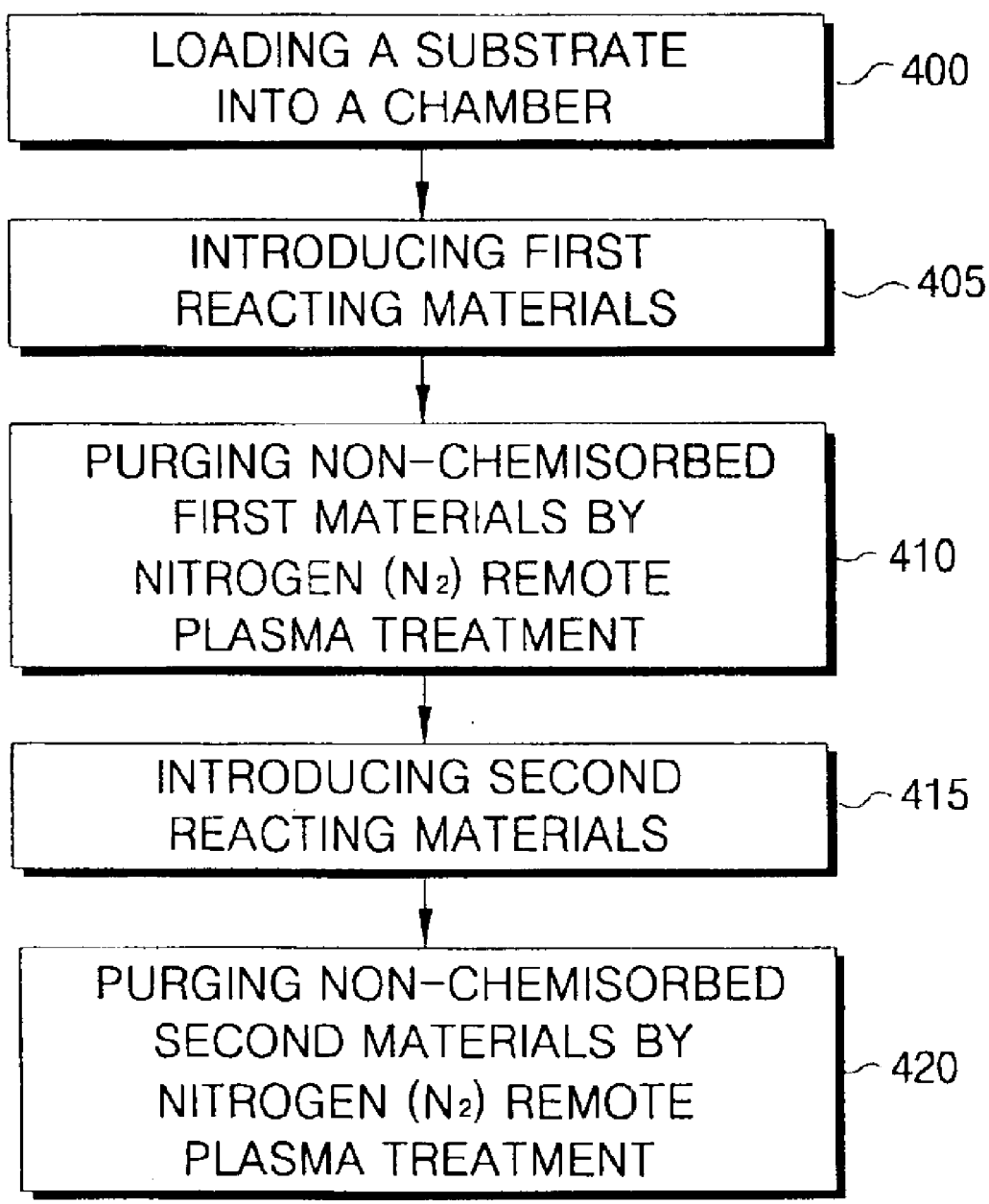
FIG. 7 is a flow chart for explaining a method of forming a thin film according to a fourth embodiment of the present invention.

FIG. 7 is a flow chart for explaining a method of forming a thin film according to a third embodiment of the present invention.

According to this embodiment, a silicon nitride (SiN) is deposited using an ALD process, as described above, at a temperature of about 550° C. The DCS gas and the ammonia ($NH_3$) gas are used as the first and the second reacting materials, respectively. A flow rate of the ammonia ($NH_3$) gas to the DCS gas is about 4.5:1. The ammonia ($NH_3$) gas is provided by a remote plasma generator.

First, a silicon substrate is loaded into the chamber (step 400). A DCS dosing step is carried out for about 20 seconds to supply the first reacting materials (step 405), and a first nitrogen ($N_2$) gas, activated by the remote plasma generator, is also supplied into the chamber. The activated first nitrogen ($N_2$) gas not only purges non-chemisorbed DCS from the chamber, but also removes hydrogen bonds from a single atomic layer, such as a silicon layer, deposited on the substrate by the DCS (step 410). The first nitrogen ($N_2$) remote plasma treatment, e.g., DCS purging step, is carried out for about 10 seconds. The chamber is then pumped out for about 4 seconds so that the internal pressure of the chamber is in a vacuum state. As a result, all or substantially all of the residual gases remaining in the chamber are removed from the chamber. An ammonia ($NH_3$) gas, activated by the remote plasma generator, is dosed as a second reacting material for about 35 seconds (step 415), and a second nitrogen ($N_2$) gas, activated by the remote plasma generator, is introduced into the chamber. The activated first nitrogen ($N_2$) gas not only purges non-chemisorbed ammonia ($NH_3$) from the chamber, but also removes hydrogen bonds from a silicon nitride layer deposited on the substrate (step 420). The second nitrogen ($N_2$) remote plasma treatment, e.g., $NH_3$ purging step, is carried out for about 10 seconds. The chamber is pumped out for about 4 seconds so that the internal pressure of the chamber is in a vacuum state. As a result, all or substantially all of the residual gases remaining in the chamber are removed from the chamber.

The following table 4 shows a processing time and a flow rate at each step of the whole process according to the fourth embodiment of the present invention.

TABLE 4

|  | DCS dosing | DCS purging | Vacuum treatment | NH3 dosing | NH3 purging | Vacuum treatment |
|---|---|---|---|---|---|---|
| Processing time (sec) | 20 | 10 | 4 | 35 | 10 | 4 |
| Flow rate (slm) | 1 | 2 | 0 | 4.5 | 2 | 0 |
| Plasma |  | On |  | On | On |  |

FIG. 8 is a table showing hydrogen content in the silicon nitride (SiN) layer deposited by a conventional method and the above-described embodiments of the present invention.

The silicon nitride thin film by the conventional method was deposited through the ALD process at a temperature of about 550° C. The DCS dosing steps and the $NH_3$ dosing steps for depositing the silicon nitride thin film according to the four embodiments of the present invention were carried out for about 20 seconds and about 35 seconds, respectively.

Referring to FIG. 8, while the hydrogen concentration of the silicon nitride (SiN) layer deposited by using the conventional method is about 11.75 atom percentage (hereinafter referred to as atomic %), the hydrogen concentration of the silicon nitride (SiN) layer deposited by using the first embodiment of the present invention, in which the nitrogen ($N_2$) remote plasma treatment was carried out after the DCS dosing step, is about 6.95 atmoic %. In addition, the hydrogen concentration of the silicon nitride (SiN) layer deposited by using the second embodiment of the present invention, in which the nitrogen ($N_2$) remote plasma treatment was carried out after the ammonia ($NH_3$) dosing step, is about 6.95 atmoic %.

Practicing the third embodiment of the present invention, in which the first nitrogen ($N_2$) remote plasma treatment was carried out after the DCS dosing step, and the second nitrogen ($N_2$) remote plasma treatment was carried out after the ammonia ($NH_3$) dosing step, the silicon nitride (SiN) thin film is formed having a hydrogen concentration of about 8.81 atomic %. Furthermore, practicing the fourth embodiment of the present invention, in which the DCS dosing step was performed by the first nitrogen ($N_2$) remote plasma treatment, and the ammonia ($NH_3$) dosing step was performed by the second nitrogen ($N_2$) remote plasma treatment, the silicon nitride (SiN) thin film is formed having a hydrogen concentration of about 11.02 atomic %.

Accordingly, the table as shown in FIG. 8 indicates that the hydrogen concentration of the silicon nitride (SiN) deposited by the embodiments of the present invention is considerably lower than a conventional method.

Among the above embodiments of the present invention, the first embodiment, in which the nitrogen ($N_2$) remote plasma treatment was performed after the DCS dosing step, deposits a silicon nitride (SiN) thin film with lowest hydrogen content. According to a basic mechanism of the ALD process, the silicon nitride (SiN) is formed by chemical reaction between the DCS and the ammonia ($NH_3$). That is, first, the single atomic layer such as a silicon layer is deposited on the substrate by the DCS dosing, and then the second reacting material such as the ammonia ($NH_3$) gas is dosed into the chamber. Then, the DCS and the ammonia ($NH_3$) gas are reacted with each other to thereby form the silicon nitride (SiN) layer. Therefore, when the ammonia ($NH_3$) gas is to be dosed after the hydrogen bonds in the single atomic layer formed by using the DCS are removed using the nitrogen ($N_2$) remote plasma treatment. Thus, the concentration of N—H bonds in the silicon nitride (SiN) thin film is considerably reduced.

While the above described embodiments of the present invention discloses that the nitrogen ($N_2$) remote plasma treatment is applied to the ALD process, it is natural that the nitrogen ($N_2$) remote plasma treatment can also be applied to the chemical vapor deposition (CVD) process to thereby reduce the hydrogen content in a thin film deposited using a CVD process. According to the embodiments of the present invention, the nitrogen ($N_2$) remote plasma treatment is carried out after dosing the first reacting material or the second reacting material. Therefore, the hydrogen bonds of the single atomic layer, formed by chemisorption of the first reacting material onto the substrate, or of the thin film, formed by chemical reaction between the first reacting material and the second reacting material, can be removed. Accordingly, a thin film is formed having a lower hydrogen content.

While the present invention has been described in detail with reference to the preferred embodiments thereof, it should be understood to those skilled in the art that various changes, substitutions and alterations can be made hereto without departing from the scope and spirit of the invention as defined by the appended claims.

What is claimed is:

1. A method of forming a thin film, comprising:
   (a) positioning a substrate in an inside of a chamber;
   (b) introducing first reacting materials into the chamber;
   (c) forming a single atomic layer on the substrate by chemisorbing a portion of the first reacting materials onto the substrate;
   (d) treating the single atomic layer with a first nitrogen ($N_2$) plasma treatment to reduce a hydrogen content in the single atomic layer;
   (e) introducing second reacting materials into the chamber; and
   (f) reacting a portion of the second reacting materials with the single atomic layer to form a thin film on the substrate.

2. The method of claim 1, wherein the thin film includes nitride.

3. The method of claim 1, wherein the step (d) further comprises removing non-chemisorbed first reacting materials from the chamber.

4. The method of claim 1, further comprising removing non-chemisorbed first reacting materials from the chamber before the step (d).

5. The method of claim 1, further comprising, after the step (f):

(g) treating the thin film with a second nitrogen ($N_2$) plasma treatment to reduce a hydrogen content in the thin film.

6. The method of claim 5, wherein the step (g) further comprises removing non-chemisorbed second reacting materials from the chamber.

7. The method of claim 5, further comprising removing non-chemisorbed second reacting materials from the chamber before the step (g).

8. The method of claim 1, wherein the steps (b) to (f) are repeated at least once.

9. The method of claim 1, wherein the step (d) further includes forming a nitrogen ($N_2$) plasma in a plasma generator located on an outside of the chamber.

10. The method of claim 5, wherein the step (g) further includes forming a nitrogen ($N_2$) plasma in a plasma generator located on an outside of the chamber.

11. A method of forming a thin film, comprising:
    (a) positioning a substrate in an inside of a chamber;
    (b) introducing first reacting materials into the chamber;
    (c) forming a single atomic layer on the substrate by chemisorbing a portion of the first reacting materials on the substrate;
    (d) removing non-chemisorbed first reacting materials from the chamber;
    (e) introducing second reacting materials into the chamber;
    (f) forming a thin film on the substrate by reacting a portion of the second reacting materials with the single atomic layer; and
    (g) treating the thin film, wherein the steps (b) to (g) are repeated at least once with a nitrogen ($N_2$) plasma treatment to reduce hydrogen content in the thin film.

12. The method of claim 11, wherein the thin film includes nitride.

13. The method of claim 11, wherein the step (g) further comprises removing non-reacted second reacting materials from the chamber.

14. The method of claim 11, further comprising removing non-reacted second reacting materials from the chamber before the step (g).

15. The method of claim 11, wherein the step (g) further includes forming a nitrogen ($N_2$) plasma in a plasma generator located on an outside of the chamber.

* * * * *